United States Patent [19]

Kaneko

[11] Patent Number: 4,720,168

[45] Date of Patent: Jan. 19, 1988

[54] LASER BEAM COLLIMATING APPARATUS

[75] Inventor: Yutaka Kaneko, Yokohama, Japan

[73] Assignee: Ricoh Company, Ltd., Tokyo, Japan

[21] Appl. No.: 817,029

[22] Filed: Jan. 8, 1986

[30] Foreign Application Priority Data

Jan. 10, 1985 [JP] Japan .................................... 60-2476

[51] Int. Cl.$^4$ ................................................ G02B 7/02
[52] U.S. Cl. ................................................ 350/253
[58] Field of Search ................. 350/253, 6.7, 6.8, 448, 350/1.1

[56] References Cited

U.S. PATENT DOCUMENTS 4,609,945  9/1986  Oguino ................................ 350/253

FOREIGN PATENT DOCUMENTS 5915206  7/1982  Japan .................................... 350/253
59-15204  1/1984  Japan .................................... 350/253
59-15205  1/1984  Japan .................................... 350/253

Primary Examiner—Bruce Y. Arnold
Assistant Examiner—Loha Ben
Attorney, Agent, or Firm—Cooper, Dunham, Griffin & Moran

[57] ABSTRACT

A laser beam collimating apparatus includes a semiconductor laser, a collimating lens and a support for holding the laser and the lens spaced apart from each other over a predetermined distance. The material for forming the support has a linear expansion coefficient a which can cancel out a deviation of the focal distance of the collimator lens due to temperature change. In particular, it is, preferably, structured such that the relation of $a = R \times n$ holds, wherein R is the change rate of the oscillating wavelength of the semiconductor laser with temperature (nm/°C.) and n is the dispersion of the glass material forming the collimator lens.

8 Claims, 3 Drawing Figures

LASER BEAM COLLIMATING APPARATUS

BACKGROUND OF THE INVENTION

1. Field of the Invention

This invention relates to an apparatus for collimating a laser beam, and, in particular, to an apparatus for collimating a laser beam emitted from a semiconductor laser device.

2. Description of the Prior Art

A semiconductor laser is well known in the art and widely used as a source for emitting a laser beam in various devices. However, since a laser beam emitted from a semiconductor laser is divergent, it is common practice to use a collimator lens for converting such a divergent beam into a collimated beam before use. For this reason, when a semiconductor laser is to be used as a light source, it is normally used in combination with a collimator lens and a holding member for holding the semiconductor laser and the collimator lens as spaced apart over a predetermined distance. Thus, a laser beam collimating apparatus normally includes three elements: a semiconductor laser, a collimator lens, and a holding member for holding the laser and the lens as spaced apart over a predetermined distance.

However, there are two factors which could drive the laser beam coming out of the collimator lens out of being collimated in such a laser beam collimating apparatus. The first factor is a temperature variation which would cause the holding member to thermally expand or contract. If this happens, since the holding member determines the distance between the collimator lens and the semiconductor laser, the distance between the semniconductor laser and the collimator lens varies so that the collimator lens becomes incapable of properly collimating the laser beam emitted from the semiconductor laser. The second factor resides in the fact that the oscillating wavelength of the laser beam emitted from the semiconductor laser varies with temperature. When the oscillating wavelength of the laser beam varies, due to the dispersion characteristic (i.e., the property of variations of the refractive index depending on the wavelength) of the glass material forming the collimator lens, the focal distance of the collimator lens changes substantially, thereby driving the laser beam output from the collimator lens out of being collimated.

It is true that, in order to cope with the first factor, it has been proposed, as disclosed in the Japanese Patent Laid-open Pub. No. 59-15206, to construct the holding member in a composite structure using several materials different in linear expansion coefficient such that the thermal variations in length in these various materials cancel out in total, thereby maintaining a constant distance between the semiconductor laser and the collimator lens. However, since this approach requires the holding member to have a composite structure, the overall structure becomes rather complicated and thus difficulty exists in manufacture. On the other hand, as a measure to cope with the second factor, it is conceivable to control the temperature at the semiconductor laser so as to keep it constant; however, such a scheme also requires a rather complicated temperature control mechanism which necessarily makes the overall structure complicated and larger in size.

SUMMARY OF THE INVENTION

In accordance with the present invention, there is provided a laser beam collimating apparatus which comprises a semiconductor laser, collimating means for collimating a laser beam emitted from the laser, and holding means for holding the laser and the collimating means as spaced apart from each other, wherein the holding means comprises a material whose linear expansion coefficient is substantially equal to the product between the change rate of the oscillating wavelength of the semiconductor laser with temperature and the dispersion of the glass material forming the collimator lens. With this structure, the distance between the semiconductor laser and the collimator lens can be maintained always at a focal distance of the collimator lens and the structure is very simple and thus easy and inexpensive to manufacture.

It is therefore a primary object of the present invention to obviate the disadvantages of the prior art as described above and to provide an improved laser beam collimating apparatus.

Another object of the present invention is to provide an improved laser beam collimating apparatus which is simple in structure, and, thus, easy and inexpensive to manufacture.

A further object of the present invention is to provide an improved laser beam collimating apparatus high in performance and reliability.

Other objects, advantages and novel features of the present invention will become apparent from the following detailed description of the invention when considered in conjunction with the accompanying drawings.

DESCRIPTION OF THE PREFERRED EMBODIMENTS

Broadly speaking, the present invention provides a laser beam collimating apparatus which includes a semiconductor laser, a collimator lens for collimating a laser beam emitted from the laser, and a holding member for holding the laser and the lens as spaced apart from each other. With such a structure, denoting the change rate of the oscillating wavelength of the semiconductor laser with temperature by R (nm/C.°), the dispersion of the collimator lens by n (nm$^{-1}$), and the linear expansion coefficient of the material forming the holding member by a (°C.$^{-1}$), then, in accordance with the principle of the present invention, the following relation holds.

$$a \simeq R \times n \tag{1}$$

Thus, when a semiconductor laser to be used has been selected, the value of R is determined, and, then, if the collimator lens has been selected, the dispersion n is determined. Under the condition, the value of the linear expansion coefficient a is determined from the above relation (1), so that the only thing which remains is to select an appropriate material, whose linear expansion coefficient substantially matches such a calculated value, for the holding member. Alternatively, if the selection has been made for the semiconductor laser and the material for the holding member, then an appropriate glass material for the collimator lens can be selected so as to satisfy the above relation (1). Furthermore, the material of the holding member and the glass material for the collimator lens can be first selected, and then an appropriate semiconductor laser can be selected in accordance with the above relation (1).

Figure 1:
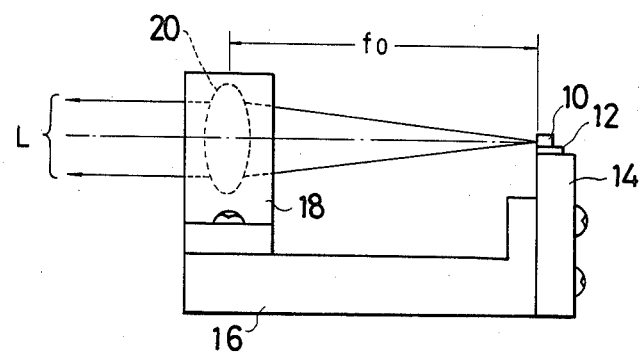
FIG. 1 is a schematic illustration showing a laser beam collimating apparatus constructed in accordance with one embodiment of the present invention.

Now, referring to FIG. 1, there is shown a laser beam collimating apparatus constructed in accordance with one embodiment of the present invention. As shown, the apparatus includes a semiconductor laser 10, which is fixedly attached to a vertically extending heat sink block 14 through a mount 12, a horizontally extending holding member 16, to one end of which is fixedly attached the block 14, and a lens holder 18, which is fixedly attached to the other end of the holding member 16 and which holds a collimator lens 20. Thus, when activated, the semiconductor laser 10 emits a laser beam, which is divergent, and this divergent laser beam is converted into a collimated laser beam by passing through the collimator lens 20 held in position by the lens holder 18.

In the illustrated laser beam collimating apparatus, the standard temperature for designing the apparatus is denoted by $T_0$ and the focal distance of the collimator lens 20 under the standard temperature condition is denoted by $f_0$. It is assumed that the semiconductor laser 10 emits a laser beam having the wavelength of $r_0$ at temperature $T_0$, and, thus, the focal distance $f_0$ stands valid for a laser beam having this wavelength $r_0$. In addition, the linear expansion coefficient of the material forming the holding member 16 is denoted by a. Thus, under the standard temperature $T_0$ condition, the distance between the semiconductor laser 10 and the collimator lens 20 is $f_0$, so that if a laser beam having the wavelength of $r_0$ is emitted from the semiconductor laser 10, there is obtained a collimated laser beam L at the output side of the collimator lens 20.

Now, let us consider the situation in which temperature $T_0$ changes by dT. With such a temperature change, the holding member 16 undergoes a thermal deformation so that the amount of such a thermal deformation in length, i.e., a change in distance between the semiconductor laser 10 and the collimator lens 20, is denoted by dl. Thus, we have, $dl = a \cdot f_0 \cdot dT$. For the convenience of explanation, it is assumed here that the thermal deformation is a thermal expansion. With this thermal deformation in the holding member 16, the distance between the semiconductor laser 10 and the collimator lens 20 varies from $f_0$ to $f_0+dl$.

On the other hand, with this change in temperature by dT, the oscillating wavelength of the semiconductor laser 10 changes from $r_0$ to $r_0+dr$. As a result, the change rate of the oscillating wavelength with temperature, or R, can be expressed as follows:

$$R = dr/dT \qquad (2).$$

Figure 2:
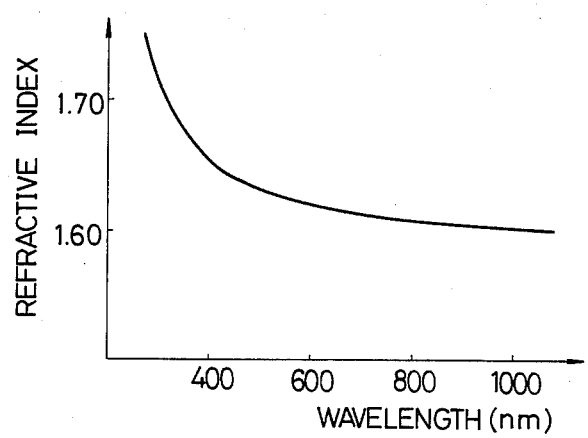
FIG. 2 is a graph for explaining the dispersion characteristic of the glass material forming the collimator lens provided in the structure shown in FIG. 1.

As graphically shown in FIG. 2, the refractive index of the glass material forming the collimator lens 20 typically changes with the wavelength of light, and, in general, the refractive index decreases as the wavelength increases. Of course, the characteristic curve differs if the glass material forming the collimator lens 20 differs. The curve shown in FIG. 2 is for light flint glass. If the refractive index of the collimator lens 20 changes in accordance with the wavelength of the light passing therethrough in this manner, the focal distance of the collimator lens 20 also varies accordingly. That is, in general, if the wavelength increases, the focal distance also increases. Thus, such a variation in focal distance is denoted by df. Then, the dispersion of the collimator lens 20 may be defined as in the following manner.

$$n \, dr = \frac{df}{f_0}, \text{ i.e., } n = \frac{1}{f_0} \frac{df}{dr}.$$

Therefore, the variation of coal distance df due to the dispersion of the collimator lens 20 can be expressed as:

$$df = nf_0 dr \qquad (3).$$

On the other hand, the amount of deformation dl due to thermal expansion of the holding member 16 is given by $dl = a \times dT \times f_0$, as described previously. And, thus, if dl=df, the variation of the focal distance due to the dispersion is canceled by the change in distance between the semiconductor laser and the collimator lens due to thermal expansion, so that there is always obtained a collimated laser beam outputted from the collimator lens 20 irrespective of temperature changes.

The condition of dl=df is equal to the relation of $af_0 dT = nf_0 dr$. And, thus, using the relation of $dr = RdT$ (cf. equation (2)), we have, $$af_0 dT = nf_0 RdT \qquad (4).$$

From this, we can obtain the following relation.

$$a = n \times R$$

Thus, if the laser beam collimating apparatus is structured to satisfy the above-mentioned relation (1), it is ensured that a substantially collimated laser beam can be obtained always irrespective of any temperature change.

Figure 3:
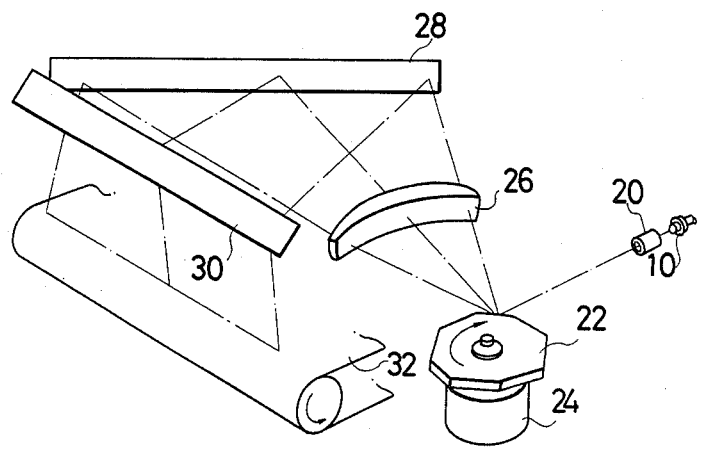
FIG. 3 is a schematic, perspective view showing one example of a laser printer to which the present laser beam collimating apparatus may be advantageously used.

Now, the present invention will be described with reference to a specific application. FIG. 3 shows in perspective a laser printer to which the present invention may be advantageously applied. As shown in FIG. 3, the semiconductor laser 10 and the collimator lens 20 are provided, spaced apart from each other and supported by a holding member (not shown in FIG. 3) constructed in accordance with the principle of the present invention to define a laser beam collimating apparatus. Also provided in the structure shown in FIG. 3 is a polygonal mirror 22 which is driven to rotate by a motor 24 in the direction indicated by the arrow at high speed, and it serves as a scanner, thereby deflecting the collimated laser beam over a predetermined angle. The laser beam deflected by the polygonal mirror 22 passes through an $f\theta$ lens 26 and is reflected by a pair of reflecting mirrors 28 and 30, to reach an imaging surface of a photosensitive belt 32, which is driven to travel as indicated by the arrow. Due to the function of the $f\theta$ lens 26, the laser beam is made convergent and thus it impinges on the photosensitive belt 32 in the form of a spot.

With the rotation of the polygonal mirror 22 driven by the motor 24, the spot moves across the photosensitive belt 32 linearly, thereby carrying out scanning. Under the condition, if the laser beam emitted from the semiconductor laser 10 is modulated by an image signal, there is formed an electrostatic latent image on the photosensitive belt 32 in accordance with the image signal. It is to be noted, however, that the photosensitive belt 32 is previously uniformly charged, as is well known to one skilled in the art. The latent image thus formed is then developed to form a toner image, which is then transferred to a sheet of transfer paper, and, then, the transferred toner image is fixed to the transfer paper, thereby obtaining a recorded image in accordance with the image signal.

Described more in detail, it is assumed that, under design conditions, the focal distance $f_0$ of the collimator lens 20 is 9 mm and the focal distance $f_c$ of the $f\theta$ lens 26 is 300 mm. The diameter of the laser spot formed on the photosensitive belt 32 is approximately 80 microns for the resolution of 400 dots/inch, and the beam depth is approximately $\pm 2$ mm. In this case, the spacing accuracy dx between the semiconductor laser 10 and the collimator lens 20 may be set as dx being equal to or smaller than $(f_0/f_c)^2 \times (\pm 2 \text{ mm}) = 1.8$ microns. In addition, it is assumed that use is made of FDS3 (Special Dense Flint 3) as the material for forming the collimator lens 20, whose dispersion $n=8.1\times 10^{-5}$ is in the region near the wavelength of 780 nm, and that, as the semiconductor laser 10, use is made of a semiconductor laser having a GaAlAs/GaAs double hetero junction structure and having the oscillating wavelength of 780 nm.

In a laser printer as shown in FIG. 3, the laser beam collimating apparatus can undergo a temperature change approximately between 0° C. and 50° C. in view of the surrounding condition and the temperature increases within the printer through use. Since the standard design temperature is normally 20° C. as mentioned before, the range of temperature fluctuations at the laser beam collimating apparatus is around $\pm 30°$ C. In addition, it is known that the change rate of the oscillating wavelength with temperature R of the above-mentioned semiconductor laser is 0.22 nm/°C. Thus, if the temperature at the semiconductor laser 10 changes from the reference temperature over 30° C., the change of the oscillating wavelength owing to this temperature change is $dr=0.22\times 30=6.6$ nm. Then, the change of focal distance df of the collimator lens 20 due to this change of the wavelength can be calculated according to the before-mentioned equation (3) as $8.1\times 10^{-5} \times 9$ mm $\times 6.6$ nm $=4.8$ microns.

On the other hand, the amount of thermal deformation of the holding member 16 for the temperature change of 30° C. $9\times 30\times a = 270 \cdot a$ mm. Thus, in order to satisfy the relation of dl=df, the linear expansion coefficient a of the holding member 16 should be $1.7\times 10^{-5}$. In fact, the spacing accuracy between the semiconductor laser 10 and the collimator lens 20 is in the order of 1.8 microns as previously mentioned, and this is equal to $\frac{1}{3}$ of the above-calculated df. Thus, the allowable range for the difference between dl and df may be set such as abs(dl−df), i.e., an absolute value of a difference between dl and df, being equal to or larger than df−df/3 and equal to or smaller than df+df/3. As a result, the allowable range for the linear expansion coefficient a is set as a being equal to or larger than $1.2\times 10^{-5}$ and equal to or smaller than $2.7\times 10^{-5}$. Or, using the dispersion n, we have the condition that a is equal to or larger than $0.15\times n$ and equal to or smaller than $0.33\times n$. Accordingly, it is only necessary to select the material for forming the holding member 16 which has a linear expansion coefficient falling onto the above-described range. Such material includes aluminum ($a=2.4\times 10^{-5}$), brass ($a=1.8\times 10^{-5}$), SUS(18-8) ($a=1.6\times 10^{-5}$), aluminum die-cast ADC12 ($a=2\times 10^{-5}$), etc. In particular, brass and SUS(18-8) have linear expansion coefficient values which are close to the ideal value of $1.7\times 10^{-5}$. If the holding member 16 is formed from aluminum die-cast ADC12, then the value of dl is 9 mm$\times 2\times 10^{-5}\times 30°$ C. $=5.4$ microns, so that the difference with df is 0.6 microns.

As described above, in accordance with the present invention, there is provided a novel temperature-compensated laser beam collimating apparatus. With the apparatus constructed in accordance with the principle of the present invention, the variation of the focal distance of the collimator lens due to the change of the oscillating wavelength of the semiconductor laser due to temperature change is compensated by the thermal deformation of the holding member due to temperature change, so that there is always obtained a collimated laser beam irrespective of any temperature change. Thus, there is no need to control the temperature at the semiconductor laser at high accuracy, and, moreover, there is no need to provide any complicated structure for temperature compensation.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A laser beam collimating appartus comprising:
   emitting means for emitting a laser beam;
   collimating means for receiving said laser beam and outputting it as a collimated laser beam; and
   holding means for holding said emitting means and said collimating means spaced apart from each other over a predetermined distance, wherein said holding means includes a material whose thermal deformation over a given temperature change cancels a change of the focal distance of said collimating means caused by a change of a wavelength of said laser beam emitted by said emitting means, wherein said change of a wavelength, in turn, is caused by said temperature change.

2. Apparatus of claim 1 wherein said emitting means includes a semiconductor laser and said collimating means includes a collimator lens comprised of a glass material.

3. Apparatus of claim 2 wherein said holding means includes a holding member having a horizontally extending portion having said semiconductor laser and said collimator lens mounted on both ends thereof.

4. Apparatus of claim 3 wherein, denoting a change rate of an oscillating wavelength of said semiconductor laser by R (nm/°C.), a dispersion of said glass material forming said collimator lens by n (nm$^{-1}$), and a linear expansion coefficient of said material forming said horizontaly extending portion of said holding member by a (°C.$^{-1}$), these parameters satisfy a relation of $a \simeq R \times n$.

5. Apparatus comprising:
   a laser light source whose wavelength varies with temperature by R nm/°C.;
   a collimator lens which receives laser light from the source and outputs a collimated light beam when spaced from the source by a selected distance along an axis, said collimator lens having a dispersion n nm$^{-1}$; and a support which supports the source and the lens spaced from each other and has a thermal expansion coefficient a °C.$^{-1}$ in the direction of said axis; wherein the parameter a is substantially equal to the product of the parameters n and R.

6. Apparatus as in claim 5 in which the lens comrises glass material.

7. Apparatus as in claim 5 including a photosentsitive member and means for scanning the collimated laser light beam across said member in a selected pattern.

8. Apparatus comprising:

a semiconductor laser which emits laser light at a wavelength which changes with ambient temperature;

a collimating lens made of a glass material which receives laser light emitted by the laser to collimate said light; and holding means for holding the laser and the collimating lens spaced apart from each other, which is made of a material whose thermal expansion coefficient substantially corresponds to the product of the change rate of the laser light wavelength with ambient temperature and the dispersion of the glass material forming the collimating lens.

* * * * *